United States Patent [19]

Eby et al.

[11] Patent Number: 5,146,431
[45] Date of Patent: Sep. 8, 1992

[54] METHOD AND APPARATUS FOR PAGE RECALL OF DATA IN AN NONVOLATILE DRAM MEMORY DEVICE

[75] Inventors: Michael D. Eby, Battle Gound, Wash.; Katsumi Fukumoto, Nara, Japan; Michael J. Griffus; Giao N. Pham, both of Vancouver, Wash.

[73] Assignee: Sharp Kabushiki Kaisha, Japan

[21] Appl. No.: 585,771

[22] Filed: Sep. 20, 1990

[51] Int. Cl.$^5$ .............................................. G11C 8/00
[52] U.S. Cl. ................................ 365/238.5; 365/236
[58] Field of Search .................... 365/236, 238.5, 233, 365/235, 230.03

[56] References Cited

U.S. PATENT DOCUMENTS 4,471,471  9/1984  DeMaria ........................ 365/185 X
4,611,309  9/1986  Chuang et al. ...................... 365/185

OTHER PUBLICATIONS

Terada et al., "A New Architecture for the NVRAM an EEPROM Backed-up Dynamic RAM", IEEE Journal of Solid-State Circuits, vol. 23, No. 1, Feb. 1988, pp. 86-90.
Yamauchi et al., "A Versatile Stacked Storage Capacitor On Flotox Cell For Megabit NVRAM Applications", IEDM 89, Dec. 1989, pp. 25.5.1-25.5.4.

Primary Examiner—Joseph A. Popek
Attorney, Agent, or Firm—Morrison & Foerster

[57] ABSTRACT

In a non-volatile DRAM (NVDRAM) memory device comprised of NVDRAM cells, each comprising a DRAM cell and an EEPROM cell, a method and apparatus for the page recall of data whereby the page recall start address may be specified by the user through the memory device's external control pins. A page of memory cells is defined as all of the memory cells connected to a single word line. During any recall operation, data are recalled from EEPROM to DRAM in only one memory cell per bit line. The externally specified page recall start address is input onto an external pad. It is then transmitted through an address selector circuit into the inputs of a counter circuit. The outputs of the counter circuit serve as the page recall start address, which reenters the address selector circuitry to be transmitted to address decoding circuitry.

9 Claims, 5 Drawing Sheets

METHOD AND APPARATUS FOR PAGE RECALL OF DATA IN AN NONVOLATILE DRAM MEMORY DEVICE

BACKGROUND OF THE INVENTION

This invention relates generally to an integrated memory device and, more specifically, to a method and apparatus for the page recall of data in an NVDRAM memory device.

An NVDRAM cell has been described in "A New Architecture for the NVRAM--An EEPROM Backed-Up Dynamic RAM", IEEE Journal of Solid State Circuits, Vol. 23, No. 1, Feb. 1988; by Chuang et al. in U.S. Pat. No. 4,611,309; and in Yamauchi et al., "A Versatile Stacked Storage Capacitor on Flotox Cell for Megabit NVRAM Applications", from 1989 International Electron Devices Meeting Technical Digest, pages IEDM 89-595 through 598. These references are incorporated herein by reference.

A design related to that of the present invention is described in the article submitted herewith as Appendix A, entitled "A 256-bit Non-Volatile Dynamic RAM With ECC and Redundancy", by Fukumoto et al., which is incorporated herein by reference.

An NVDRAM memory device, as has been described by Dimaria in U.S. Pat. No. 4,471,471, comprises an array of NVDRAM cells. Each NVDRAM cell includes a DRAM cell and an EEPROM cell. The DRAM cell, which typically includes a MOS transistor in series with a storage capacitor, is volatile, while the EEPROM cell, which stores data in the form of charge on a floating gate in a floating gate MOS transistor, is non-volatile. The advantage of the NVDRAM is that while data may be quickly read from and written to the DRAM during normal operation, it can be stored in the non-volatile EEPROM during power down. The EEPROM data in an NVDRAM, however, is not directly accessible and must be transferred to the DRAM before being read.

An NVDRAM has at least three operating modes: (1) a DRAM read/write mode in which the NVDRAM operates like a regular DRAM; (2) a store mode in which the DRAM data is transferred to the EEPROM to be stored; and (3) a recall mode in which the EEPROM data is transferred to the DRAM to be accessed.

In the normal DRAM read/write operating mode, the EEPROM transistor is turned off, and data are written to and read from the DRAM cell in the conventional manner —namely, the DRAM transistor is turned on when data is to be stored on or read from the DRAM storage capacitor and, otherwise, is turned off.

When the DRAM data needs to be stored in the EEPROM, a store operation, which transfers the DRAM data to the EEPROM, is executed. The data is now stored as charge on the floating gate of the EEPROM transistor. When the EEPROM data needs to be recalled to the DRAM, a recall operation is executed. This operation involves sensing the logic state of the EEPROM and, accordingly, charging a full logic state 1 or logic state 0 voltage level onto the DRAM storage capacitor.

In static-RAM-based NVRAM devices in current use, each memory cell is essentially a cross-coupled latch which has two stable operating states. These stable states are established by active circuit elements within each of the memory cells. The active circuit elements act either as a pull-up, providing a full rail logic 1 state, or as a pull-down, providing a full rail logic 0 state. Since each memory cell has the same pullup or pull-down capability, each can independently achieve the full rail logic states. Either a capacitive or current imbalance is established in each memory cell by the programmed state of the EEPROM portion of each cell.

During the recall operation in such an NVDRAM, both sides of the latch are initially set to the same potential, and they are then allowed to charge from that point. The imbalance between the two sides of the cell causes the two sides to charge at different rates, such that the latch will be predisposed to one of the two stable states. Therefore, once the latch is set, these two states will be full rail logic 0 or logic 1 voltage levels. Because of this design of static-RAM-based NVRAM devices, no external initiation of the restore function is necessary to place full logic levels in the memory cells. In addition, such NVRAM devices are able to use a block mode recall operation, in which all data in all memory cells in the device are transferred from EEPROM to RAM simultaneously.

In contrast, in a dynamic-RAM-based NVRAM device (NVDRAM), the memory cells have no built-in restore capability. Unlike in a static-RAM-based NVRAM, data in each memory cell of an NVDRAM is stored as a variable charge on a capacitor. There are no active pull-up or pull-down circuit elements within each cell. Consequently, there is no means for altering the capacitor charge on each cell independently. Therefore, circuitry external to the memory cell itself must be used to provide a full rail logic 0 or logic 1 potential on the memory cell capacitor.

Lacking an externally initiated restore operation following an EEPROM to DRAM data recall in an NVDRAM device, the memory cells will contain degraded logic state 0 or 1 voltage levels. When the data in the DRAM memory cells are subsequently read out conventional DRAM fashion, these degraded memory cell states may result in incorrect data being sensed. Therefore, it is necessary to perform a conventional DRAM restore operation during the recall operation to ensure full logic state 0 or 1 voltage levels in the DRAM cell. This restore operation can only reliably occur to one memory cell per bit line at any one time. Thus, in a DRAM-based NVRAM device (NVDRAM), simultaneous recall of all memory cells (i.e. block mode recall) is not feasible; only one memory cell per bit line should be recalled at any one time.

SUMMARY OF THE INVENTION

Accordingly, it is an object of the present invention to provide a method and apparatus for the page recall of data in an NVDRAM memory device—a page being defined as all of the memory cells on one word line. Each memory cell is connected to a different bit line from all of the other cells on a given page. Thus, in the present invention, only one memory cell per bit line is recalled during each page recall operation— minimizing DRAM data degradation.

It is another object of this invention to provide a method and apparatus by which the starting address of a page recall operation in an NVDRAM device may be specified. The user has the option of either recalling only a single page of memory cells at the specified address, or several consecutive pages of cells beginning at the specified address.

Recalling only desired pages of memory cells is often more efficient than recalling every cell in the device. For instance, one might want to divide the memory in the device into several partitions. In this case, since each partition functions as a separate piece of memory and can be used separately from all of the others, it may be more efficient to recall data only from those pages comprising a certain partition rather than from every page in the device.

The present invention comprises a method and apparatus for the page recall of data in an NVDRAM device. The page recall start address may be specified through an external input pad. The user has the option of either recalling only a single page of memory cells at the specified address or consecutive pages of cells starting at the specified address. Only one memory cell per bit line is recalled during each recall operation.

The externally specified start address is input onto an external pad. It is then transmitted through an address selector circuit into the inputs of a counter circuit. The outputs of the counter circuit serve as the page recall start address, which reenters the address selector circuitry to be transmitted to address decoding circuitry.

BRIEF DESCRIPTIONS OF THE DRAWINGS

DETAILED DESCRIPTION OF THE PREFERRED EMBODIMENTS

An NVDRAM device contains a plurality of memory cells to be recalled. These are shown as memory cells 500 in FIG. 5, which are connected along bit lines $B_1$ through $B_m$, and in addition along recall lines $R_1$ through $R_{n+n}$ and word lines $W_1$ through $W_{n+n}$. The word lines WL are used to address the cells 500, in a manner to be described in detail below, and the bit lines B are used to recall data stored in the cells 500. In short, one word line WL (e.g., $WL_i$, where $1 < i < n+n$) is addressed at a time, and then all of the bit lines B are activated simultaneously. Then, the recall line associated with the active word line (in this case, $R_i$) is activated to recall the data from the cells 500 on the active word line. This procedure is described in detail below.

The NVDRAM Design

The memory cells 500 preferably include NVDRAM cells which are as described in applicants' copending patent application, filed on Sept. 20, 1990, entitled "Method for Measuring EEPROM Threshold Voltages in a Nonvolatile DRAM," which is incorporated herein by reference. However, other NVDRAM cell designs may be used, and the present invention will be applicable to such cells if they are arranged in an array such as that of FIG. 5, and are addressed by word lines or their equivalent, and undergo recall operations by means of recall lines or their equivalents.

The Page Recall Apparatus and Procedure

Figure 2:
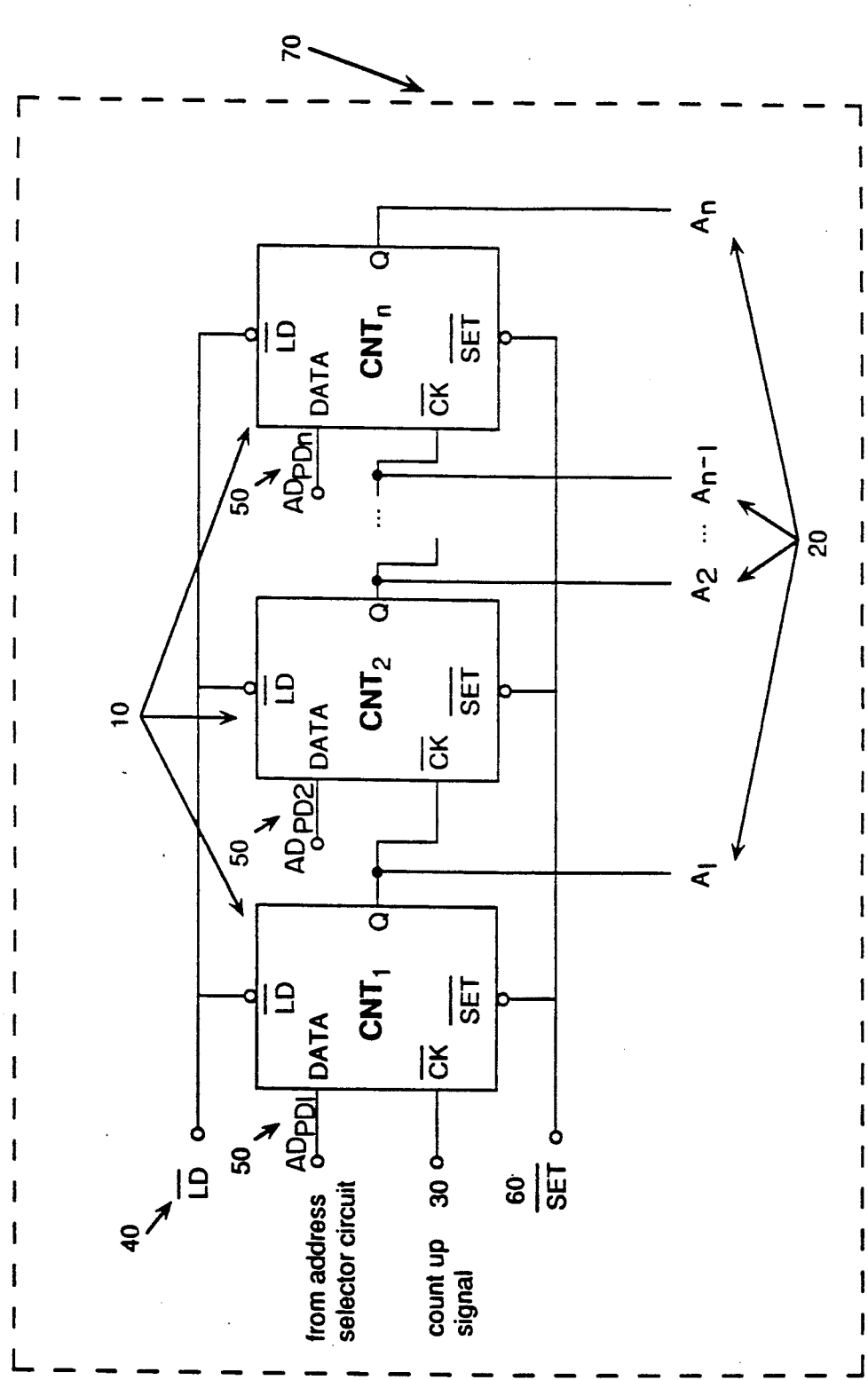
FIG. 2 is a circuit diagram of a counter circuit of the invention.
Figure 3:
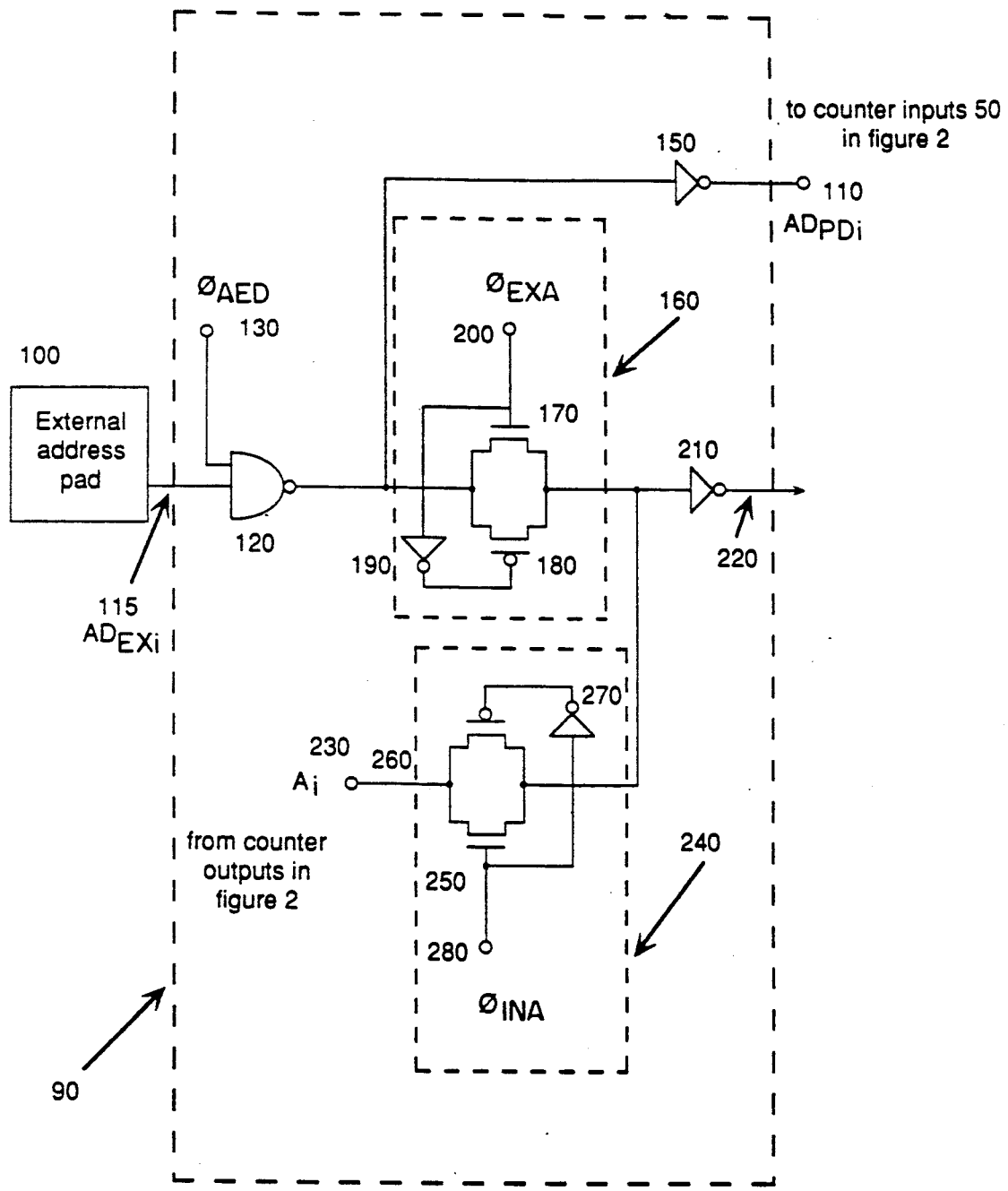
FIG. 3 is a circuit diagram of an address selector circuit of the invention.
Figure 4:
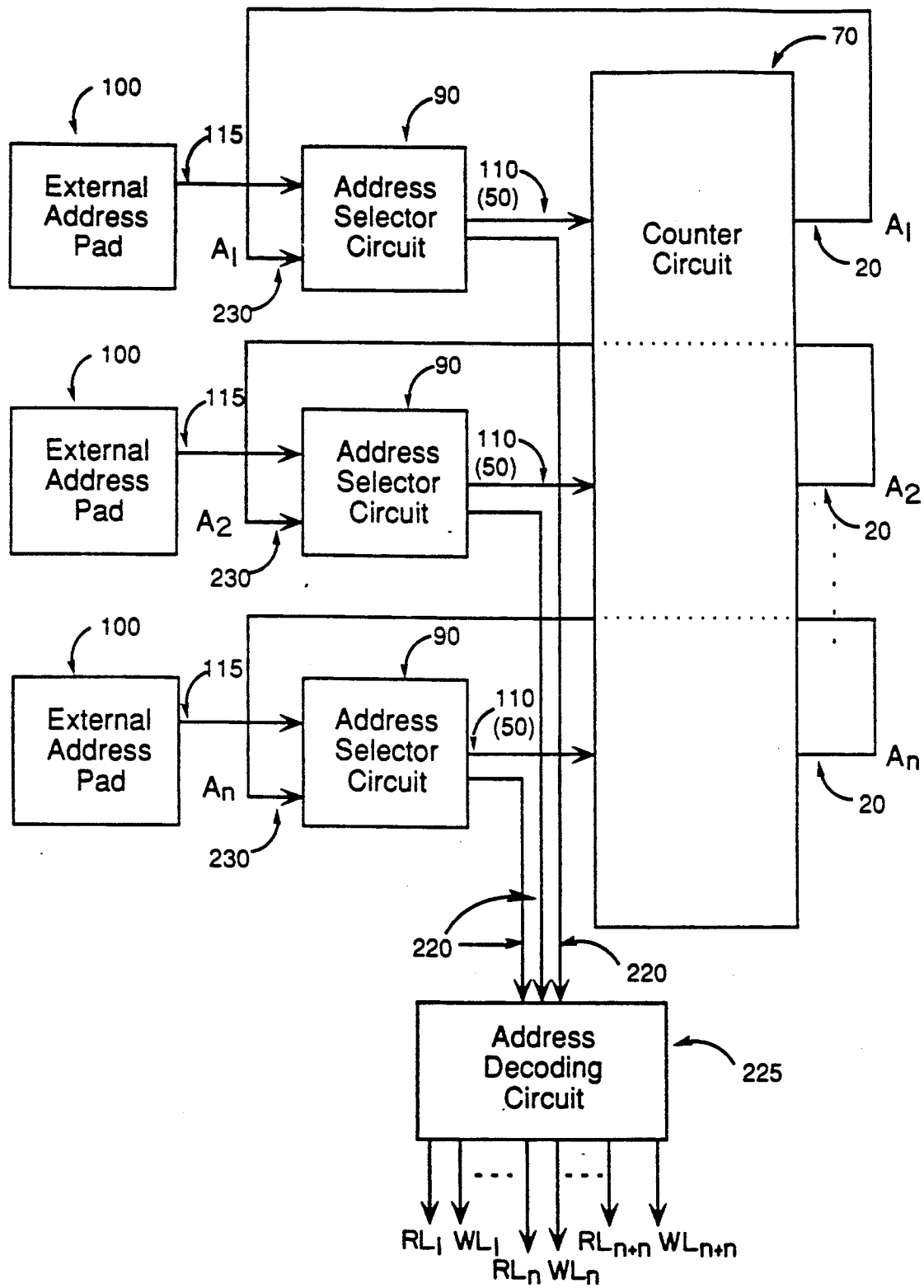
FIG. 4 is a top-level block diagram of apparatus of the invention.

Referring to FIG. 4, external address pads 100 send address inputs 115, corresponding to a predetermined page recall start address, to address selector circuits 90 (shown in FIGS. 3 and 4). These address inputs are provided as outputs 110 to counter inputs 50 shown in FIG. 2 (discussed below). In addition, they are provided as outputs 220 to address decoding circuitry 225 (shown in FIGS. 3 and 4). The address decoding circuitry generates signals $RL_1$ through $RL_{n+n}$ and signals $WL_1$ through $WL_{n+n}$.

In FIG. 4, the number of external address pads 100 is determined by the number of recall lines RL and word lines WL which need to be addressed. In the preferred embodiment, there are n+n word lines and recall lines, and the external address pad generates a binary representation of the signals provided to these lines, so that there are $\log_2(n+n)$ (or $1+\log_2 n$) external address pads.

In FIG. 2, conventional parallel load counters ($CNT_1$ through $CNT_n$) 10 are cascaded together in a conventional counter circuit 70 to construct an n-bit counter whose outputs 20 are $A_1$ through $A_n$. Each counter 10 has an output Q and inputs DATA, clock (CK-bar), load bar (LD-bar) and set bar (SET-bar). Except for counter $CNT_n$, the Q output of each counter is connected to the clock (CK-bar) input of the successive counter. Every time count up signal 30 is pulsed, output 20 of the counter circuit increments by 1. Every time LD-bar 40 goes low, inputs ($AD_{pd1}$ through $AD_{pdn}$) 50 are loaded onto outputs ($A_1$ through $A_n$) 20, respectively. These outputs 20 are decoded to generate the signals WL shown in FIGS. 4 and 6. Finally, sending SET-bar low resets outputs ($A_1$ through $A_n$ 20) to logic zeros.

Referring now to FIG. 4, the counter circuit 70 has as inputs 50 the outputs 110 from a number of address selector circuits 90, which in turn have inputs 115 which are the outputs from the external address pads 100. Preferably, only one of the recall lines and one of the word lines will be a logical 1, the others being 0, as discussed below.

Given the inputs from the external address pads, the address selector circuit sends the address represented thereby either to the counter circuit or to the address decoding circuit, depending upon the internal state of the circuits 90. Thus, the address signals may be sent via outputs 110 to inputs 50 of the circuit 70, and they are then fed back into the circuits 90 for sending to the address decoding circuit 225. This procedure, described below, allows addresses to be selected at random by a user, or automatically generated by the apparatus of the invention.

FIG. 3 is a circuit diagram of one address selector circuit 90, which interfaces between an address pad 100 and counter circuit inputs ($AD_{pd1}$ through $AD_{pdn}$) 50 in FIG. 2. There is one such address selector circuit per address line; in the case of address lines ($A_1$ through $A_n$) 20, there are n address selector circuits in the memory device. The address selector circuits FIG. 3 is the one associated with counter input ($AD_{pdi}$) 110.

A pad address input 115 from external address pad 100, which input corresponds to counter input ($AD_{pdi}$) 110, is one input into NAND gate 120; the other input is ($\phi_{AEB}$) 130. The output from NAND gate 120 feeds through inverter 150 to become counter input $AD_{psi}$ 110. The output from NAND gate 120 also connects to the input of transmission gate 160, which comprises an n-channel MOS transistor 170, a p-channel MOS transistor 180 and an inverter 190. In transmission gate 160, the source of transistor 170 is connected to the drain of transistor 180, the drain of transistor 170 is connected to the source of transistor 180, and the gate of transistor 180 is the complement of the gate of transistor 170, connected via inverter 190. The gate of transistor 170 also receives address enable input $\phi_{EXA}$ 200.

The output of transmission gate 160 flows through inverter 210 and appears as output 220, which inputs into address decoding circuitry 225 external to address selector circuit 90.

Another input to address selector circuit 90 is input $(A_i)$ 230, which connects to transmission gate 240. The output of transmission gate 240 then flows through inverter 210 and ends upon as output 220, which is input to the address decoding circuit 225, as shown in FIG. 4.

Transmission gate 240, similarly to transmission gate 160, comprises n-channel transistor 250, p-channel transistor 260 and inverter 270, and is controlled by internal address enable input $(\phi_{INA})$ 280 into the gate of transistor 250.

Figure 1:
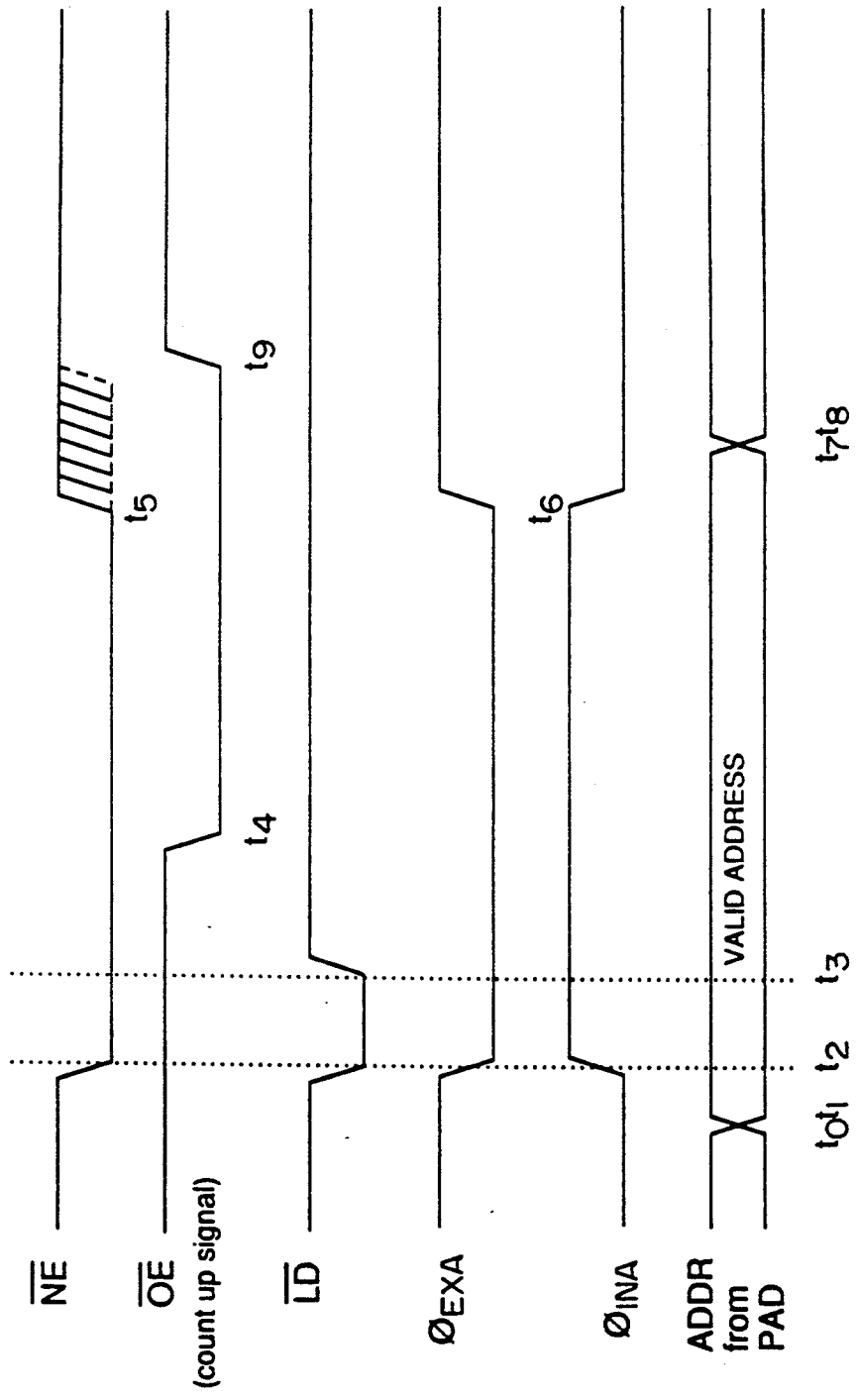
FIG. 1 is a timing diagram of various signals used in the present invention.

Signal flow through counter circuit 70 and address selector circuits 90 during a page recall operation is as follows:

In FIG. 1, from time $t_0$ to $t_1$, a desired page recall start address is input onto external address pad 100 in FIG. 3. At time $t_2$, an NVDRAM enable per signal (NE-bar) goes low. As a result, an LD-bar pulse is generated, $\phi_{EXA}$ (external address enable) 200 goes low, and $\phi_{INA}$ (internal address enable) 280 goes high. $\phi_{EXA}$ 200 is active (high) during normal operation of the NVDRAM device but stays deactivated (low) during page recall. $\phi_{INA}$ 280 is active (high) during page recall and is low during normal operation. $\phi_{AEB}$ (address enable) 130 is high at all times during the page recall process.

In the address selector circuit 90 of FIG. 3, external address input 115 from external address pad 100 is inverted through NAND gate 120, since $\phi$phd AEB 130 is high. Now, since $\phi_{EXA}$ 200 is low, transmission gate 160 is off, and input 115 is routed through inverter 150 and ends up as AD $_{psi}$ counter input 110.

Output $(AD_{pdi})$ 110 is now an input 50 to counter circuit 70 in FIG. 2. Since LD-bar is pulsed low at $t_2$ (LD-bar goes back high at $t_3$), counter input $(AD_{psi})$ 50 is loaded onto counter output $(A_i)$ 20. Counter output $(A_i)$ 20 constitutes one line of the page recall start address specified on external address pad 100 and now appears as input $(A_i)$ 230 back into address selector circuit 90 of FIG. 3.

Since $\phi_{INA}$ 280 went high at $t_2$, address signal $A_i$ 230 is now routed through transmission gate 240 and inverter 210. AT this point, input $(A_i)$ 230 now enters address decoding circuitry 225, which then translates all of the inputs $(A_i)$ 230 them into an address usable as the actual start address of the recall operation.

At $t_4$, the output enable bar signal (OE-bar) goes low and signals the start of a recall operation using the page recall starting address which was initially loaded onto external address pad !00. The page recall operation takes place between $t_4$ and $t_9$. During this operation, DRAM data will be restored from a degraded state to full logic state 0 or 1 voltage levels.

NE-bar returns high at some time after $t_5$ (to reset it), and OE-bar returns high at $t_9$ (also resetting). Before $t_9$, at some time $t_6$ and as a result of NE-bar going high, $\phi_{EXA}$ 200 goes back high and $\phi_{INA}$ 280 goes back low. From $t_7$ to $t_8$ (after $t_5$), another address may be loaded onto external address pad 100 in preparation for another recall operation.

Alternatively at this time, since OE-bar also functions as count up signal 30, output 20 of counters 10 increments by one whenever OE-bar goes high (in this case, at $t_9$). Thus, instead of inputting a new recall address from pad 100, one may choose instead to use the incremented address on counter outputs 20 to automatically recall the next consecutive page. In this case, during the subsequent page recall operation, $\phi_{INA}$ 280 going high at $t_2$ sends address signals $(A_i)$ 230, which now specify the address of the next consecutive page, through transmission gates 240 and inverters 210 to address decoding circuitry 225.

In operation, as discussed above, the address decoding circuit 225 shown in FIG. 4 is designed such that only of the word lines WL, and its associated recall line RL, will be a logical 1 for a given page recall operation. Thus, for instance, word line $WL_n$ may be activated, and then all of the bit lines $B_l$ through $B_m$ are also activated. The recall line $RL_n$ is utilized to recall the data stored on the entire page of cells, i.e. all of the cells along word line $WL_n$. The data are retrieved by the sense amplifiers, which may be conventional in design.

None of the recall lines RL should be activated except the single recall line which is associated with the word line being activated. This is because a recall operation on other cells can destroy the data in those cells, there being no restore operation being performed on those cells.

Figure 5:
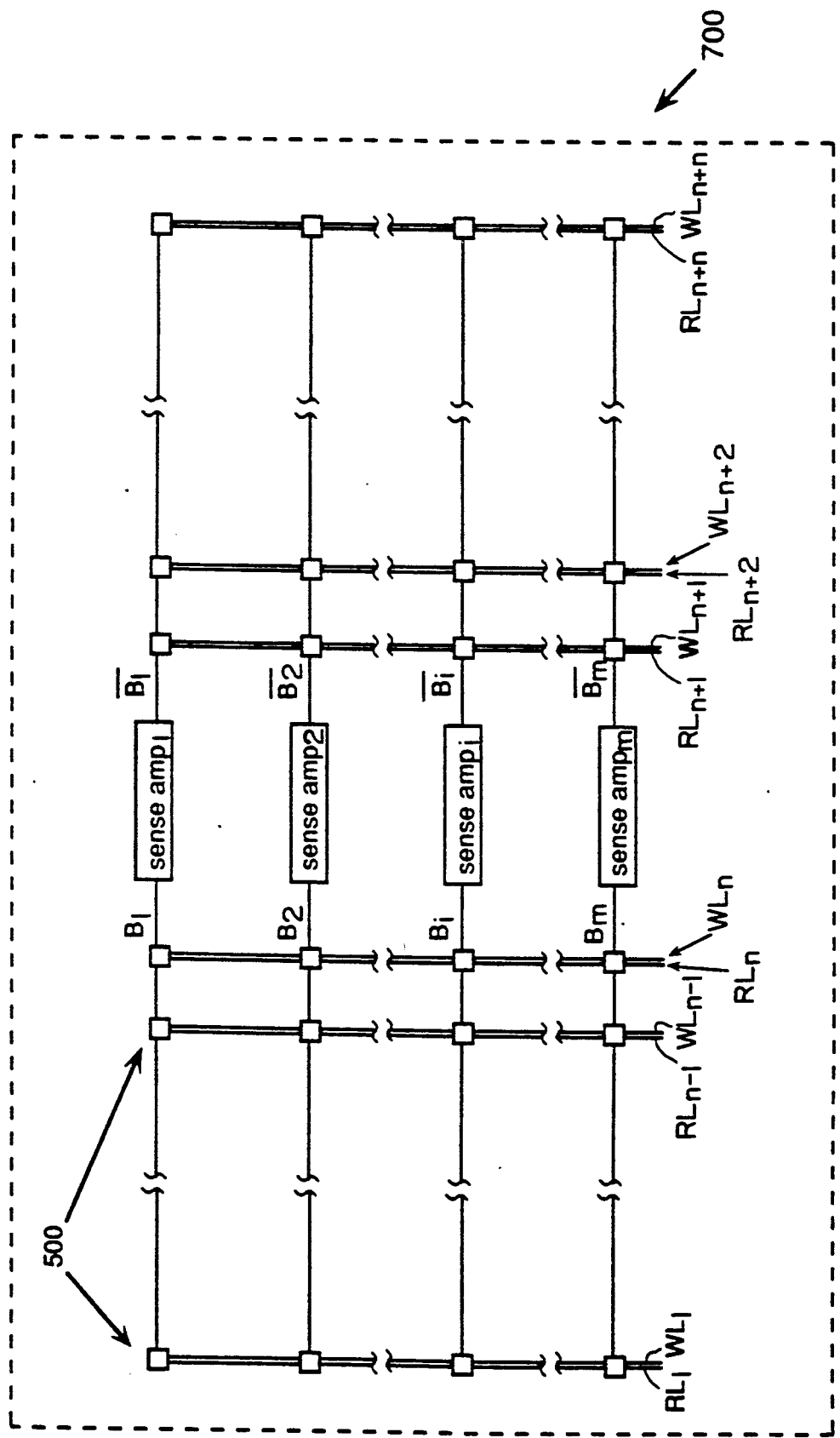
FIG. 5 is a diagram of an array of memory cells in conjunction with which the method of the invention is used.

It will be appreciated that the present invention recalls entire pages of data from an array of NVDRAM cells such as that shown in FIG. 5, utilizing addresses for such pages independently of the source of the addresses; in the present application, those addresses may be input by a user of the device or may be automatically generated by a computer or other circuitry of the invention, such as described above relative to the counters of FIG. 2.

Thus, in summary, in the present invention, one page of memory cells in an NVDRAM is recalled at any one time. A page recall start address is loaded onto pad 100 and transmitted through address selector circuits 90 to outputs 20 of counter circuit 70. Outputs 20 are then transmitted back through address selector circuits 70 to address decoding circuitry 225, which translates the page recall start address into a form usable by memory array 700 as the actual page recall start address. By incrementing counter output 20 by 1 automatically, successive pages of cells can be recalled.

By this method, the above-discussed advantages of the invention are achieved. Specifically, since block mode recall is not feasible in an NVDRAM memory device, the present invention describes a method for page recall in such a device. Moreover, the method of the present invention allows a predetermined page recall start address to be specified and consecutive pages of memory cells to be recalled.

What is claimed is:

1. In an NVDRAM memory device having address lines, an apparatus for the page recall of data, comprising:

an external pad connected to the address lines for inputting a predetermined page recall start address comprising a plurality of first start address signals, wherein said external pad includes a plurality of external pad outputs, with each said external pad output for outputting one said first start address signal;

a plurality of address selector circuits, wherein one said address selector circuit is connected to each said external pad output, each said address selector circuit having a first address selector output for outputting a second start address signal corresponding to one said first start address signal;

a counter circuit having a plurality of counter inputs, each said counter input being connected to one said first address selector output for receiving one of said second start address signals, said counter circuit further including a plurality of counter outputs, wherein each said address selector circuit includes an address selector input, and wherein each said counter output is connected to one said address selector input, wherein each said address selector circuit has a second address selector output corresponding to one of said first start address signals; and address decoding circuitry having as address decoding inputs said second address selector outputs, said address decoding circuitry for addressing a page of said data.

2. The apparatus of claim 1, wherein each said address selector circuit comprises:

a first NAND gate having as an input one of said external pad outputs and an address enable signal, and having a NAND gate output;

a first transmission gate having as an input said NAND gate output, and having a first transmission gate output;

a second transmission gate having as an input one of said counter output, and having a second transmission gate output; and wherein said first transmission gate and said second transmission gate outputs are coupled together for providing one of said first transmission gate output and said second transmission gate output at a time as said first address selector output.

3. The apparatus of claim 1, including means for incrementing said counter outputs.

4. An apparatus according to claim 3, wherein said apparatus recalls consecutive pages of data as a function of said incrementing of said counter outputs.

5. A method for page recall of data in an array of NVDRAM memory cells, wherein the array includes a plurality of bit lines, a plurality of word lines and a plurality of recall lines; wherein one bit line, one word line and one recall line is connected to each of the cells; where each bit line is connected to one of a plurality of first subset of cells in the array of cells which does not overlap with others of said first subsets of the cells to which other bit lines are connected; and where one word line and a corresponding recall line are connected to each of a plurality of second subsets of cells in the array of cells which does not overlap with others of said second subsets of the cells to which other word lines and bit lines are connected; including the steps of:

(1) activating a single one of the plurality of word lines, for addressing each cell of the second subset of cells to which the activated word line is connected, thus creating an activated second subset of cells;

(2) activating all of the bit lines, for accessing each cell in any of the first subsets of cells which is also in the activated second subset of cells; and (3) activating a recall line associated with the activated word line, for recalling data from each of the cells which is accessed as a result of step 2.

6. An NVDRAM memory device having a plurality of NVDRAM cells, each NVDRAM cell including a DRAM cell and a corresponding EEPROM cell, said NVDRAM memory device comprising:

means for reading and writing data to said DRAM cells;

store mode means for transferring data in said DRAM cells to said corresponding EEPROM cells; and recall mode means for transferring data in said corresponding EEPROM cells to said DRAM cells, wherein said recall mode means comprises means for simultaneously transferring data in a plurality of said corresponding EEPROM cells to a plurality of said DRAM cells.

7. The memory device of claim 6, further comprising a plurality of bit lines and a plurality of word lines, one bit line and one word line being connected to each of said NVDRAM cells and each of said word lines being connected to a plurality of said NVDRAM cells, and wherein said plurality of said corresponding EEPROM cells and said plurality of said DRAM cells are associated with a common word line.

8. The memory device of claim 7, further comprising address input means for inputting an address of said common word line.

9. The memory device of claim 8, further comprising counter means for generating a plurality of addresses utilized consecutively as said address of said common word line.

* * * * *